US006027864A

United States Patent [19]

Baller et al.

[11] Patent Number: 6,027,864

[45] Date of Patent: Feb. 22, 2000

[54] METHOD OF PRINTING A PATTERN ON PLATES FOR A FLAT DISPLAY DEVICE

[75] Inventors: Theunis S. Baller; Cornelis G. M. De Haas; Joseph C. M. Bosman; Sybrandus Van Heusden, all of Eindhoven, Netherlands

[73] Assignee: U.S. Philips Corporation, New York, N.Y.

[21] Appl. No.: 08/919,974

[22] Filed: Aug. 28, 1997

[30] Foreign Application Priority Data

Sep. 18, 1996 [EP] European Pat. Off. .............. 96202611

[51] Int. Cl.[7] ................................ G03F 7/00; B41F 1/18; B41M 5/00

[52] U.S. Cl. ....................... 430/320; 430/306; 101/450.1; 101/463.1

[58] Field of Search .................................... 430/311, 313, 430/314, 317, 318, 320, 302, 306, 309; 101/450.1, 451, 463.1

[56] References Cited

U.S. PATENT DOCUMENTS 4,348,255 9/1982 Schmidt .................................. 156/656

FOREIGN PATENT DOCUMENTS

WO9513623 5/1995 WIPO .

*Primary Examiner*—Kathleen Duda
*Attorney, Agent, or Firm*—Robert J. Kraus

[57] ABSTRACT

A method of printing a pattern on plates for flat display devices, in which method, in succession, a raised pattern is provided, which is then subjected to a printing process by means of an unpatterned screen-printing screen. For example, a pattern of phosphor dots or electrodes can be provided in this manner. It is also possible to make partitions, which form channels or cells on a plate for a plasma display device or PALC display device.

5 Claims, 2 Drawing Sheets

METHOD OF PRINTING A PATTERN ON PLATES FOR A FLAT DISPLAY DEVICE

BACKGROUND OF THE INVENTION

1. Field of the Invention

The invention relates to a method of printing a pattern on plates for a flat display device. The invention also relates to a display device having a channel plate comprising a number of channels which are separated from each other by parallel partitions, a display device having a cell plate comprising a number of cells which are separated from each other by partitions, and a display device comprising a plate in which apertures are formed, around which tracks are printed, which do not cover the wall of the apertures.

2. Discussion of Related Art

To manufacture flat display devices, it is necessary to print a pattern on plates. Examples hereof include a display screen with a pattern of phosphor dots, a channel plate with a pattern of parallel walls, a plasma-discharge cell plate with a pattern of walls, a plate with a pattern of electrodes. Plates for flat display devices are customarily printed by means of a screen-printing method. In EP-A-678217 (PHN 14.617) corresponding to published PCT Patent Application WO95/13623 the possibility of using a printing technique to produce electrodes for a flat display is mentioned.

A problem which occurs when a screen-printing method is used to provide a pattern on plates for flat display devices is that the screen-printing screen used in the printing process is subject to deformation during said printing process. However, in printing said plates, a high accuracy is required. This cannot be achieved by means of the known screen-printing methods.

BRIEF SUMMARY OF THE INVENTION

It is an object of the invention to provide a method which enables a pattern to be printed with sufficient accuracy on plates for a flat display device. To this end, the method in accordance with the invention is characterized in that the pattern to be printed is provided in a higher position on a plate, whereafter a printing substance is provided on the raised pattern by means of an unpatterned screen-printing screen. Printing by means of the method in accordance with the invention will hereafter also be referred to as indirect printing.

The raised pattern can be provided, for example, by means of a photolithographic process. A high accuracy is achieved by means of such a process. As the accuracy with which the raised pattern is provided determines the accuracy of the indirect printing process, the accuracy of said indirect printing process is high too.

Particularly in the manufacture of a channel plate or a plasma-discharge cell plate, use can be advantageously made of indirect printing. First, the pattern of the partitions which separate the channels or plasma-discharge cells from each other can be provided in a higher position, whereafter a succession of layers is provided thereon by printing, thereby forming the partitions.

Indirect printing can also be advantageously used to print patterns on a plate having apertures, such as a selection plate or a spacer plate for a display device, which apertures must remain free of printing substance. Screen printing is insufficiently accurate and spraying is impossible because substance would enter the apertures.

These and other aspects of the invention will be apparent from and elucidated with reference to the embodiments described hereinafter.

DETAILED DESCRIPTION OF THE INVENTION

Figure 1:
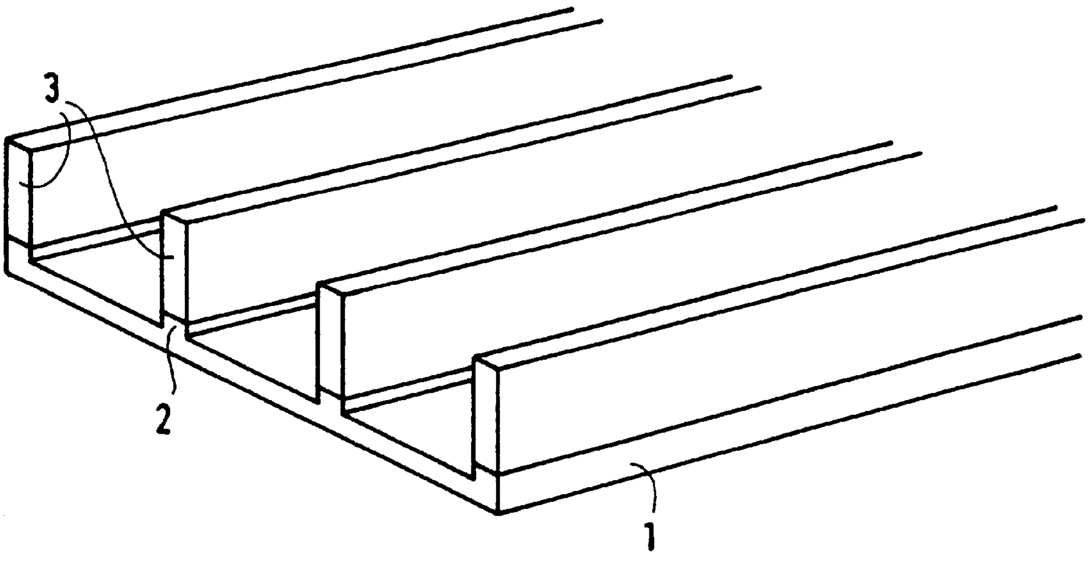
FIG. 1 is a schematic, perspective view of a part of a channel plate for a flat display device.

FIG. 1 is a schematic, perspective view of a part of a channel plate. As compared to the prior art, indirect printing enables, for example, partitions to be formed on a channel plate with much more accuracy. Said partitions can be made by repeatedly providing printing substance at the same location on the substrate. First, the desired pattern is provided, for example, by means of photolithography, with uncovered parts of the plate (1) being removed by etching, so that a raised pattern (2) remains. Subsequently, a succession of layers is printed on said pattern until the partitions (3) have reached the desired height. The channel plate can be used, for example, in an AC plasma display or a PALC (plasma-addressed liquid crystal) display. If partitions of glass are desired, glass frit is used as the printing substance.

Figure 2:
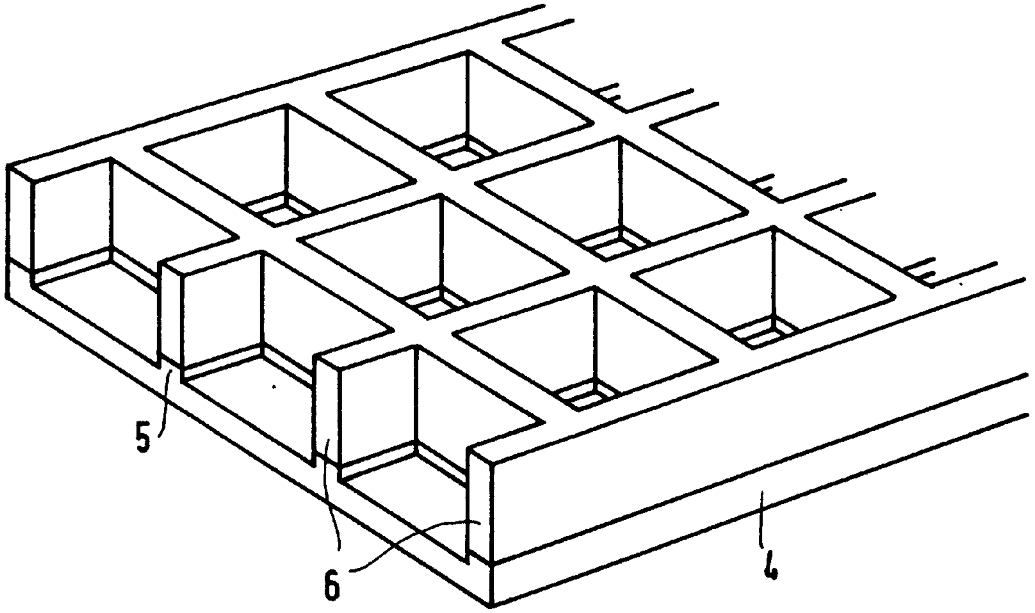
FIG. 2 is a schematic, perspective view of a part of a plasma-discharge cell plate for a flat display device.

FIG. 2 is a schematic, perspective view of a part of a plasma-discharge cell plate. The partitions of the plasma-discharge cells, for example, of a DC plasma display can be made in the same manner, by means of indirect printing, as the above-described channel plate.

Figure 3:
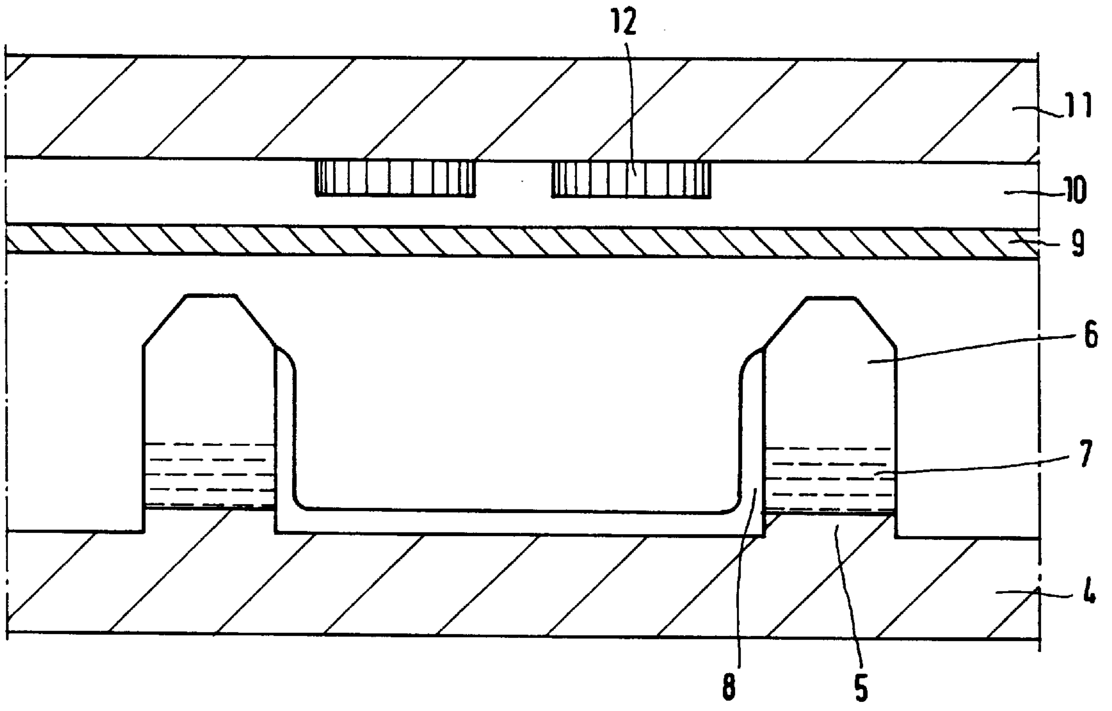
FIG. 3 is a schematic, cross-sectional view of a plasma-discharge cell.

FIG. 3 is a schematic, cross-sectional view of a plasma-discharge cell. Partitions (6) are formed on the plate (4), with the lower part of the partitions (6) consisting of the raised pattern (5) and the other part of a succession of layers printed one on top of the other, with the dotted lines (7) indicating a number of interfaces of said layers. The surface of the plate (4) is treated in such a manner that a raised pattern (5) is achieved on which the partitions (6) are formed by means of indirect printing. In this example, an MgO-layer (9), a dielectric layer (10) and a front glass plate (11) are situated above the partitions. Underneath the front glass plate there are display electrodes (12), which are made of a transparent material. In the square defined by the plate (4) and the partitions (6), there is, in this example, a fluorescent layer (8).

Figure 4:
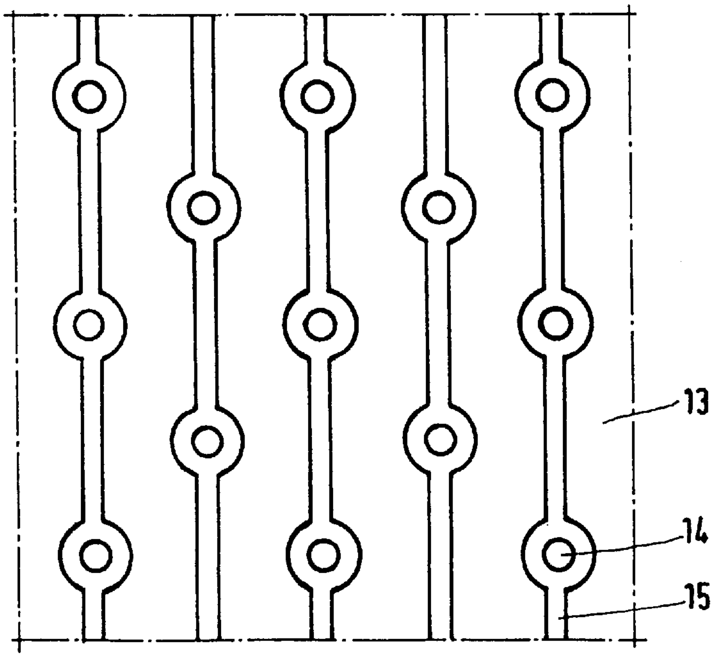
FIG. 4 is a schematic plan view of a part of a plate in which apertures are formed and which is provided with an electrode pattern.

FIG. 4 is a schematic plan view of a part of a plate (13) in which apertures are formed and which is provided with a printed pattern of electrodes. Electrode material (15) is provided around the apertures (14). In this case, indirect printing is extra advantageous because tracks must be printed which must extend over apertures in the plate, but which may not cover the wall of the apertures. This type of operation is used, for example, to manufacture plates for certain types of flat CRT displays. As stated hereinabove, ordinary screen printing is not accurate enough. Spraying is impossible because a part of the substance would enter the apertures. The above-mentioned problems are resolved by indirect printing in accordance with the invention.

The raised pattern can be formed, for example, by means of a photolithographic process. Such a process has a higher accuracy than the known screen-printing processes. An embodiment of the printing process in accordance with the invention comprises the following steps:

the substrate is covered with a photoresist lacquer.

a mask having the desired pattern is provided on the substrate coated with said photoresist lacquer.

the assembly is exposed.

the mask is removed.

the unexposed lacquer is removed, so that a lacquer pattern remains.

the substrate thus patterned is subjected to an etching process, chemical or mechanical (sandblasting), so that the parts which are no longer covered with lacquer are in a lower position than the parts still covered with lacquer, which form the pattern.

the exposed lacquer is removed.

an unpatterned screen-printing screen is provided on the substrate.

the substance to be provided is distributed on the screen-printing screen, so that the meshes of the screen are filled with said substance.

the screen-printing screen is removed, and, as a result of adhesion, the substance remains on the raised portions which engaged the screen, while, at the location of the lower portions, the substance remains in the meshes of the screen.

An additional advantage of the method is that aligning is unnecessary if the pattern is formed in a number of screen-printing steps. By virtue thereof, an extra high degree of accuracy can be achieved in the printing process.

It is alternatively possible to first provide a layer on a plate and then form the pattern from said layer. The raised pattern can also be provided by means of a screen-printing process, stencil-printing process or flexographic-printing process instead of a photolithographic process. A photoresist lacquer can be used to print a mask, whereafter a part of the surface is ablated by etching, after which the rest of the surface forms the raised pattern. Alternatively, the raised pattern can be printed directly.

In summary, the invention relates to a method of printing a pattern on plates for flat display devices, in which method, in succession, a raised pattern is provided, which is then subjected to a printing process by means of an unpatterned screen-printing screen. For example, a pattern of phosphor dots or electrodes can be provided in this manner. It is also possible to make partitions, which form channels or cells on a plate for a plasma display device or PALC display device.

We claim:

1. A method of printing a plate for a flat display device, characterized in that the plate has a first surface plane, and the pattern to be printed is provided on the plate such that the pattern to be printed has a second surface plane that is elevated above the first surface plane, whereafter a printing substance is provided on the pattern by means of an unpatterned screen-printing screen.

2. A method as claimed in claim 1, characterized in that the pattern having the second surface plane is provided by means of a photolithographic masking of select areas of the plate to produce a masked plate, followed by an etching of the masked plate.

3. A method as claimed in claim 2, characterized in that the plate is covered with a layer of material in which the pattern is formed.

4. A method as claimed in claim 1, characterized in that the pattern is printed upon the plate.

5. A method as claimed in claim 1, characterized in that the plate is covered with a layer of material in which the pattern is formed.

* * * * *